(12) United States Patent
Kuiri et al.

(10) Patent No.: US 7,403,747 B2
(45) Date of Patent: Jul. 22, 2008

(54) TUNING A STATION

(75) Inventors: Tapio Kuiri, Oulu (FI); Ville Salmi, Oulu (FI); Jorma Savolainen, Timola (FI)

(73) Assignee: Nokia Corporation, Espoo (FI)

( * ) Notice: Subject to any disclaimer, the term of this patent is extended or adjusted under 35 U.S.C. 154(b) by 287 days.

(21) Appl. No.: 10/183,720

(22) Filed: Jun. 27, 2002

(65) Prior Publication Data
US 2003/0053561 A1    Mar. 20, 2003

(30) Foreign Application Priority Data
Jun. 27, 2001    (GB)    ................. 0115764.3

(51) Int. Cl.
H04B 1/40    (2006.01)
(52) U.S. Cl. .................. 455/77; 455/161.1; 455/161.2; 455/166.1; 455/182.3; 455/185.1; 455/126; 455/115.1; 375/130; 375/141
(58) Field of Classification Search .................. 455/77, 455/161.1, 161.2, 161.3, 166.1, 166.2, 182.3, 455/185.1, 186.1, 126, 115.1, 115.2, 182.1; 375/130, 141
See application file for complete search history.

(56) References Cited
U.S. PATENT DOCUMENTS

| | | | | |
|---|---|---|---|---|
| 5,628,059 A * | 5/1997 | Kurisu | .......................... | 455/126 |
| 5,644,260 A | 7/1997 | DaSilva et al. | ............... | 327/238 |
| 5,920,808 A * | 7/1999 | Jones et al. | ............... | 455/127.1 |
| 6,366,622 B1 * | 4/2002 | Brown et al. | ................. | 375/322 |
| 6,434,204 B1 * | 8/2002 | Amir et al. | ................... | 375/346 |
| 6,694,129 B2 * | 2/2004 | Peterzell et al. | ............... | 455/76 |
| 6,714,765 B1 * | 3/2004 | Kimppa | ........................ | 455/76 |
| 6,873,643 B2 * | 3/2005 | Schilling | ..................... | 375/130 |
| 2002/0131389 A1 * | 9/2002 | Boesch et al. | ............... | 370/342 |
| 2004/0009752 A1 * | 1/2004 | Mohan | ........................ | 455/78 |

FOREIGN PATENT DOCUMENTS

| | | |
|---|---|---|
| EP | 0843448 A1 | 5/1998 |
| GB | 2334187 A | 8/1999 |
| WO | WO-00/59171 A | 10/2000 |

OTHER PUBLICATIONS

Lohtia A. et al., "An adaptive digital technique for Compensating for Analog Quadrature Modulator/Demodulator Impairments", Communications, Computers and Signal Processing, May 19, 1993, IEEE vol. 2, pp. 447-450, Pacific Rim Conference.

* cited by examiner

Primary Examiner—Sanh D. Phu
(74) Attorney, Agent, or Firm—Harrington & Smith, PC

(57) ABSTRACT

A method of tuning a station is disclosed, wherein a first pilot signal is applied on a circuit of the station and the resulting output power of the signal circuit is subsequently detected. A second pilot signal is then applied to the circuit and the resulting output power of the circuit is detected. The offset of the circuit is then tuned based on information of the resulting output power detected for the first and second signals. A station that is adapted to implement the method may be tuned by the manufacturer thereof or later after having already been taken into use. The tuning may occur automatically as response to a predefined event.

26 Claims, 4 Drawing Sheets

TUNING A STATION

BACKGROUND OF THE INVENTION

1. Field of the Invention

The present invention relates to tuning of a station, and in particular, but not exclusively, to tuning of modulator means of a station.

2. Description of the Related Art

A station such as a transmitter, a receiver or a transceiver can be used for communication media towards another station. The station may comprises user equipment such as a mobile station of a cellular communication system. Said other station may be another node in the communication system. The other node may comprise user equipment or a base station of a communication system and so on. The communication may be transmitted as analogue or digital signals or a combination of these, such as by digitally-modulated analogue signals.

One or more of the components of a station may introduce an undesired error to the signal produced by the station. This means that the station may produce a signal that does not correctly represent the information that was intended to be communicated by means of the station. The error may be caused, for example, by variations in the components used for the station. Therefore, a procedure known as tuning or calibration is typically required at the end of the manufacturing process of a station. The tuning is accomplished to ensure that the manufactured station meets the quality requirements and/or technical specification set for it.

An error that may need to be corrected by the calibration is the so called offset voltage. The offset voltage may cause an error, often referred to carrier leakage, in the signal output from the station.

The offset voltage may be caused by the processing of baseband signals. This can happen, for example, in I/Q modulators which are generally used in mobile stations or in any other station in which a baseband in-phase signal (I) and quadrature signal (Q) are processed. The quadrature techniques are typically used in modern stations in implementation of modulation of the signals.

The carrier leakage has been conventionally compensated in a transmitter station by tuning the station before it is taken into use. This tuning can be done by utilizing test signals in I and Q branches of the station. These signals are first driven to zero and then DC signals on both branches are subsequently adjusted so that the output power of the station at an output power level detector in minimised. One of said DC signals is then incremented or decremented by small steps and the change in the output power is recorded after each step. This continues until the output power of the modulator reaches a local minimum. The other branch is then selected and tuned by repeating the process. The step size is reduced at this stage until an optimum tuning of the station is reached.

In order to implement the above algorithm the detector needs to have a substantially high sensitivity. Typically, this is obtained by biasing the detector and providing amplification means in the detector circuit. Components required for implementing these functions may increase the complexity of the station. Furthermore, the stepwise operation is substantially time consuming. It might be advantageous, especially in mass production, if the time required by the tuning could be reduced.

The inventors have also found that it might also be advantageous in certain circumstances if a station could be tuned after the station has already been used for a while. For example, changes in the conditions in which the station is used (such as temperature or humidity and so on) may influence the operation of the station. In addition, components of the station may experience ageing, extreme conditions, even some mechanical damage and so on. In order to maintain optimal operation conditions of the station it might thus be advantageous if the station could be tuned even after the station has been in use.

SUMMARY OF THE INVENTION

Embodiments of the present invention aim to address one or several of the problems associated with tuning a station and/or seek to provide an improved solution for tuning a station.

According to one aspect of the present invention, there is provided a method of tuning a station comprising the steps of:

a) applying a first signal to a circuit of the station and subsequently detecting the resulting output power of the said circuit;

b) applying a second signal to the circuit and subsequently detecting the resulting output power of the circuit, said second signal being provided by changing the polarity of the first signal; and c) compensating offset of the circuit based on information of the resulting output power detected in steps a) and b).

According to a second aspect of the present invention, there is provided a station comprising:

signal means for applying signals to a modulator circuit of the station, said signal means being adapted to change the polarity of a first signal to produce a second signal;

detector means for detecting resulting output power; and means for tuning the offset of the modulator circuit based on information of said output power detected by the detector means.

According to a third aspect of the present invention, there is provided a method of tuning a station comprising the steps of:

a) applying a first signal to a circuit of the station and subsequently detecting the resulting output power of the said circuit;

b) applying a second signal to the circuit and subsequently detecting the resulting output power of the circuit, said second signal being provided by changing the polarity of the first signal; and c) compensating phase offset of the circuit based on information of the resulting output power detected in steps a) and b).

According to a fourth aspect of the present invention, there is provided a method of tuning a station comprising the steps of:

a) applying a first signal to a first part of a circuit of the station and subsequently detecting the resulting output power of the said circuit;

b) applying a second signal to a second part of said circuit and subsequently detecting the resulting output power of the circuit; and c) compensating a gain of the circuit based on information of the resulting output power detected in steps a) and b).

According to a fifth aspect of the present invention, there is provided a station comprising:

signal means for applying signals to a modulator circuit of the station;

detector means for detecting resulting output power; and means for tuning a gain of the modulator circuit based on information of said output power detected by the detector means.

According to a sixth aspect of the present invention, there is provided a station comprising:

signal means for applying signals to a modulator circuit of the station, said signal means being adapted to change the polarity of a first signal to produce a second signal;

detector means for detecting resulting output power; and means for tuning a phase offset of the modulator circuit based on information of said output power detected by the detector means.

In other embodiments, the steps of applying the pilot signals and subsequent detection of power levels may be repeated at least once. The tuning of the offset voltage may continue until substantially equal resulting output power level, as an indication of successful offset voltage compensation, is detected subsequent to the application of said first and second pilot signals.

The output power levels may comprise the output power levels of the modulator means of the circuit. The circuit may comprise an in-phase (I) branch and/or a quadrature phase (Q) branch of an IQ modulator for a transmitter.

The tuning may be accomplished based on a difference between the resulting output power levels for the two pilot signals.

The tuning may be based on information regarding detected carrier leakage in the station.

At least one further error may be compensated by tuning the station. The gain balance of the station and/or the phase offset of the station may be tuned.

The tuning may be controlled by a digital signal processor.

The station may comprise a mobile station of a cellular communication system. The tuning may be accomplished during the manufacturing of the mobile station. The tuning may be accomplished in response to an event after the mobile station has been in use. The tuning may be triggered automatically in response to the event.

The embodiments of the invention may provide a tuning arrangement that is faster that the above referred prior art solution. In certain circumstances a station may also be tuned after the station has already been used for a while, for example, to take changes in conditions in which the station is used or ageing or the like into account. A substantially robust tuning procedure may be provided, said tuning procedure providing a reliable, fast, and accurate tuning of the station.

Other objects and features of the present invention will become apparent from the following detailed description considered in conjunction with the accompanying drawings. It is to be understood, however, that the drawings are intended solely for purposes of illustration and not as a definition of the limits of the invention, for which reference should be made to the appended claims.

BRIEF DESCRIPTION OF THE DRAWINGS

For better understanding of the present invention, reference will now be made by way of example to the accompanying drawings in which.

DETAILED DESCRIPTION OF THE PRESENTLY PREFERRED EMBODIMENTS

Figure 1:
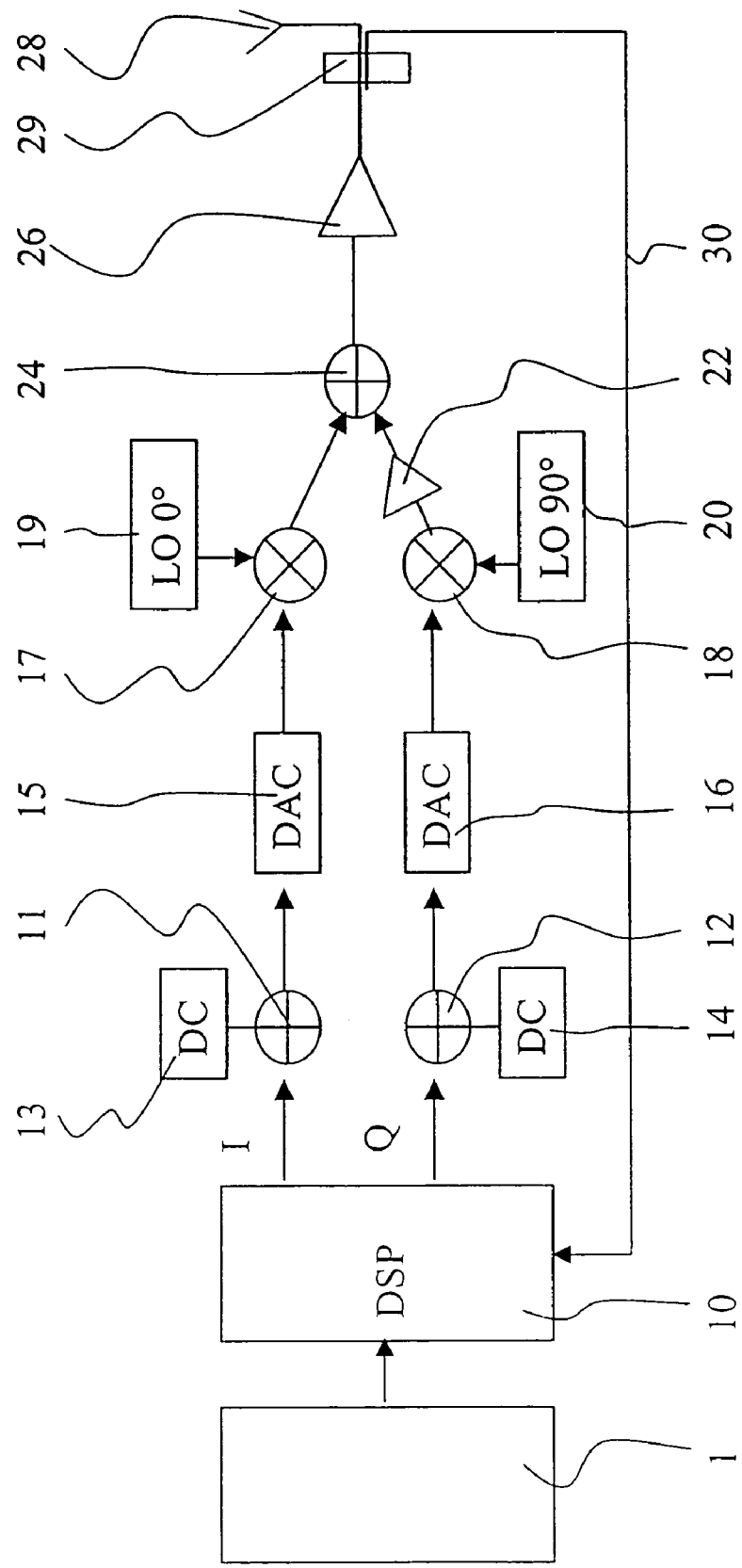
FIG. 1 shows circuitry in which an embodiment of the present invention may be employed.

Reference is first made to FIG. 1 which shows circuitry for a transmitter station comprising an I/Q modulator arrangement. A signal to be transmitted is passed from block 1 to a digital signal processor (DSP) 10. The signal may be for transmitting, for example, voice or data. The digital signal processor 10 processes the signal such that an in-phase (I) and quadrature (Q) components are produced on respective signal branches I and Q. Modulation of signals in the in-phase and quadrature components is a known procedure, and will thus not be described in any further detail.

Subsequent to the signal processor 10 signals on I and Q branches are subjected to DC offset correction at adders 11 and 12, respectively. In FIG. 1, DC registers 13 and 14 are shown to be used in the correction. However, it shall be appreciated that the manner in which the DC offset is compensated does not form an essential part of the present invention as such. The DC offset compensation or correction can be implemented by any appropriate means without affecting the basic principles of the tuning operation in accordance with the present invention. An example of another compensation techniques is digital compensation by the digital signal processor 10.

After the DC offset compensation stage a digital signal on each branch I and Q is fed to a digital to analogue converter (DAC) 15 and 16, respectively. The digital to analogue conversion is also known by the skilled person and will not be explained in any greater detail.

The analogue signal may then be upconverted at mixing means 17 and 18 by phase shifted local oscillator signals 19 and 20. Again, the upconversion and phase shifting are known features of a typical transmitter station and they will not be described in any detail.

After upconversion, the signals in I and Q branches will be passed to a summing means 24 for providing a combined signal that is to be transmitted via antenna means 28. Amplifier means 26 may also be provided for amplifying the radio frequency signal prior to the transmission thereof.

FIG. 1 also shows an output power detector means 29. The detector may be provided by means of an envelope detector and more particularly, by means of diode envelope detector. Various possibilities for detection of output power of an I/Q modulator are known and will thus not be explained in any more detail. In an embodiment that is preferred at the present an envelope detector is used. However, it shall be appreciated that any detecting means capable of detecting output power can be used herein. For example, the power may be calculated based on current consumption and voltage that are measured from the amplifier.

A feedback circuit 30 is also shown. The feedback circuit 30 is for provision of information about the detected output power for the signal processing means 10. A more precise description of the operation of the feedback circuit will also be given below.

Figure 2:
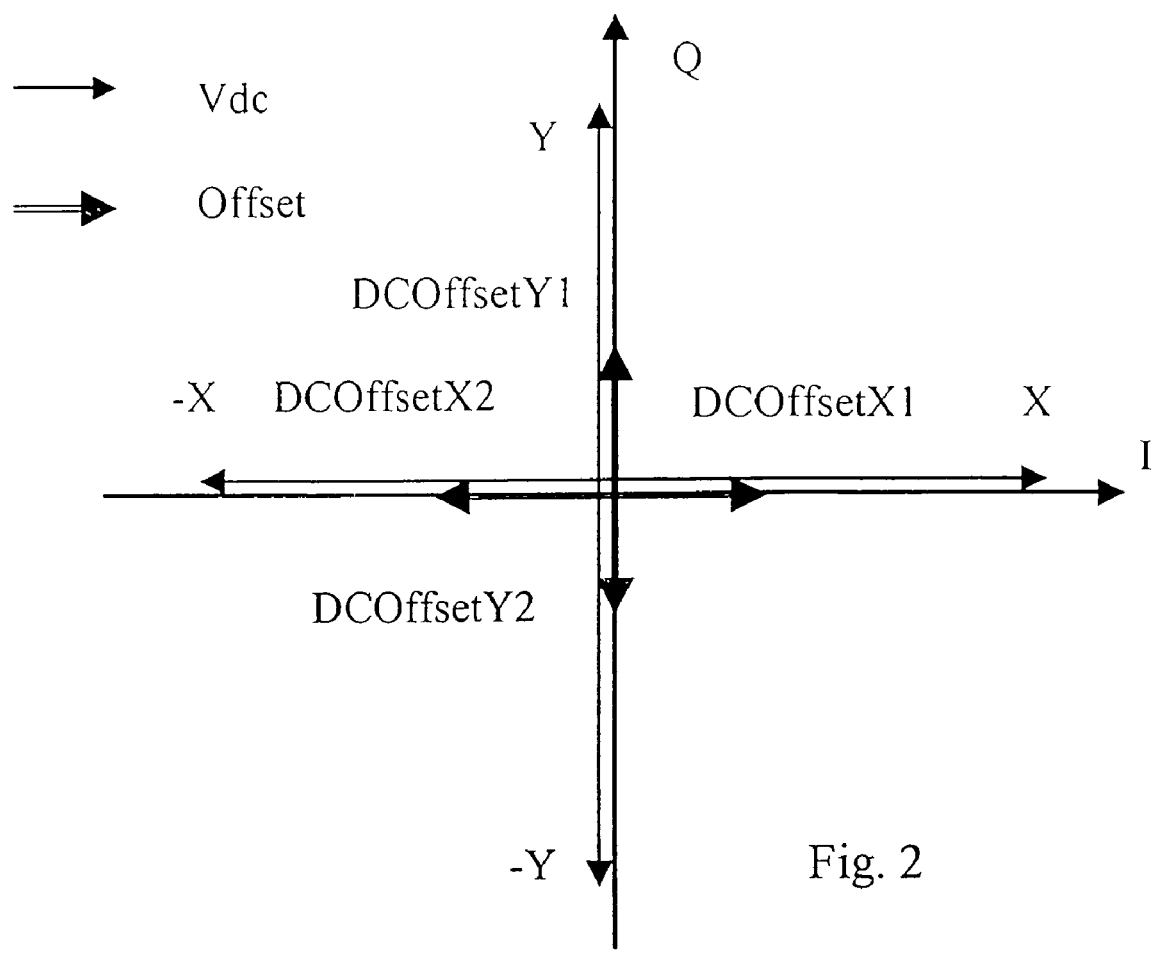
FIG. 2 shows the principles for tuning the DC offset of the FIG. 1 circuitry.
Figure 5:
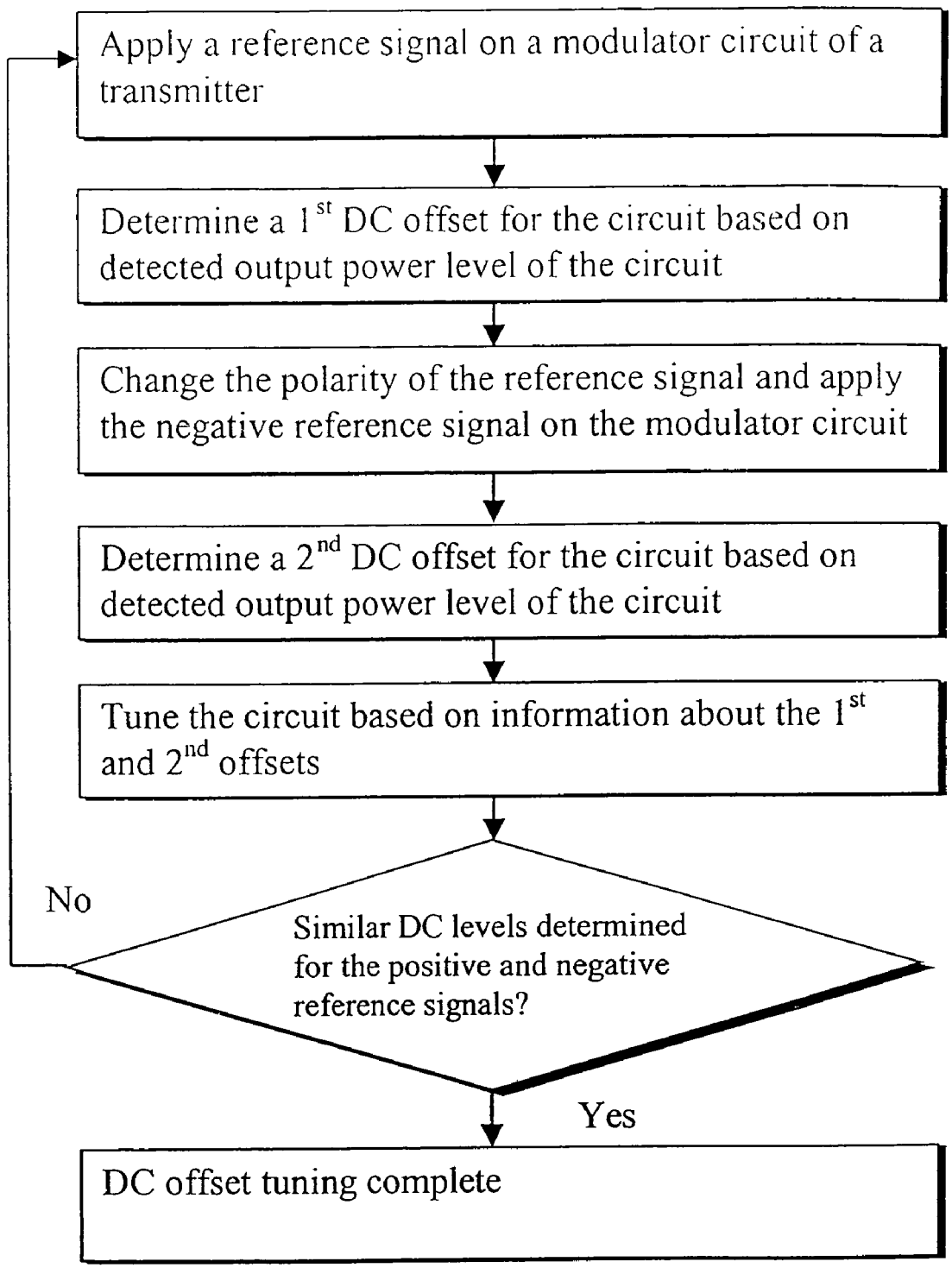
FIG. 5 is a flowchart illustrating the operation of the embodiment shown in FIG. 2.

FIGS. 2 and 5 illustrate an embodiment of tuning the FIG. 1 circuitry based on information about the carrier leakage. More particularly, a pilot signal provided by a reference voltage signal +X Vdc is applied on the I branch of the modulator circuit. As is shown by the double lined arrow, an offset voltage 'DCOffsetX1' is also present. The resulting signal 'DCOffsetX1'+X produces the output power. The output power can be measured by means of the envelope detector means 29 provided at the output of the IQ modulator.

After the output power level of the resulting signal 'DCOffsetX1'+X has been determined, another reference voltage signal −X Vdc is applied to the I branch. The other pilot signal is provided by changing the polarity of the fist pilot signal to the opposite, that is to negative. As above, the resulting signal 'DCOffsetX1'−X produces corresponding output power. This output power is then detected by envelope detector. A control algorithm provided in the signal processor 10 may then tune the I branch offset voltage 'DCOffsetX1' by producing compensating offset voltage 'DCOffsetX2' until substantially the same output power levels are detected by the detector means 28 for both the positive and negative pilot signals. The tuning may be accomplished by adding some compensation voltage to the compensation device 13. In another example the tuning is accomplished by the digital signal processor 10.

A similar procedure can be accomplished for the Q branch. In FIG. 2 the Q branch tuning is indicated by pilot signal arrows Y and −Y and corresponding offset arrows 'DCOffsetY1' and 'DCOffsetY2'.

The procedure may be repeated a few times to improve the quality of the offset compensation. However, already a single round of the above described type of calibration procedure may be enough. The inventors believe that two calibration rounds for each branch should be enough in most cases.

The pilot signals X and Y used for I and Q branches, respectively, may have a substantially similar signal level. However, pilot signals with different signal levels may be used for the I and Q branches.

The tuning is preferably done by using average transmission power levels. This is advantageous since it enables tuning when the transmitter is on the linear operation area of the end amplifier thereof.

The tuning process may be controlled by the digital signal process (DSP) 10. The feedback circuit 30 provides the DSP 10 with information regarding the detected power on the output side of the modulator arrangement. It shall be appreciated that although in FIG. 1 the feedback circuit is shown to be connected immediately before the antenna means 28 the feedback circuit could start from any point after the digital to analogue converters 15.

Figure 3:
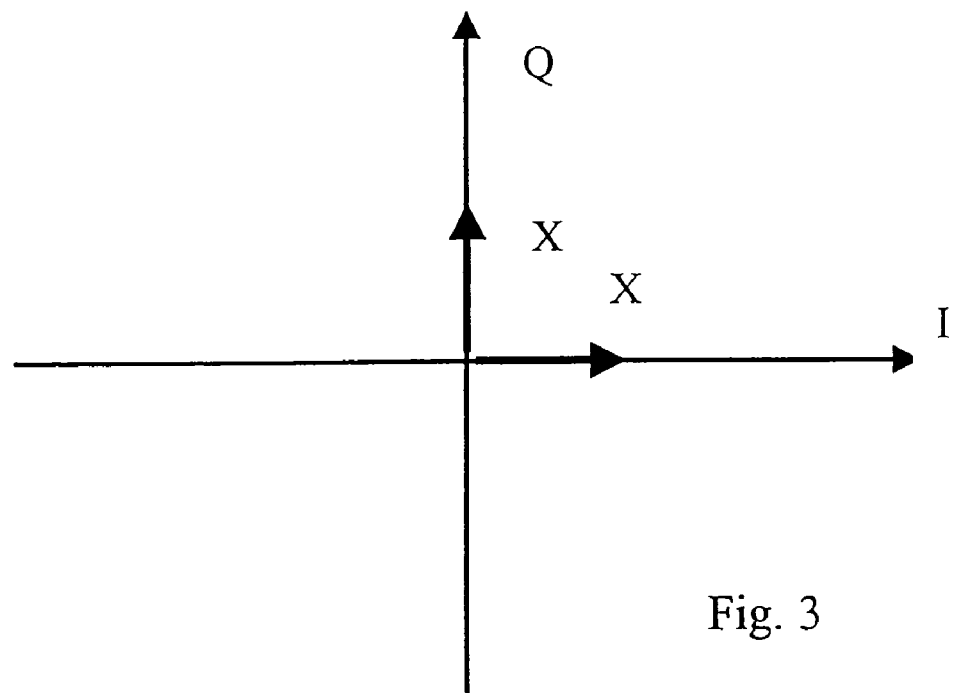
FIGS. 3 and 4 show further embodiments for tuning some other characteristics of a station.

In a transmitter station some other errors may also need to be compensated in addition to the tuning of the offset voltages. For example, the so called gain balance of the station may need to be tuned. A possibility for the tuning is illustrated by FIG. 3.

More particularly, a pilot voltage X Vdc is applied to the I branch of the I/Q modulator. The output power is then detected by means of the detector means. A corresponding pilot voltage is then applied to the Q branch and the output power is detected by the detector means. The gain of one of the branches is then tuned until a similar output power is detected.

The tuning of the gain balance may be accomplished at the same time with the calibration of the offset voltage. The tuning may be controlled by the digital signal processor (DSP) 10 of FIG. 1.

Figure 4:
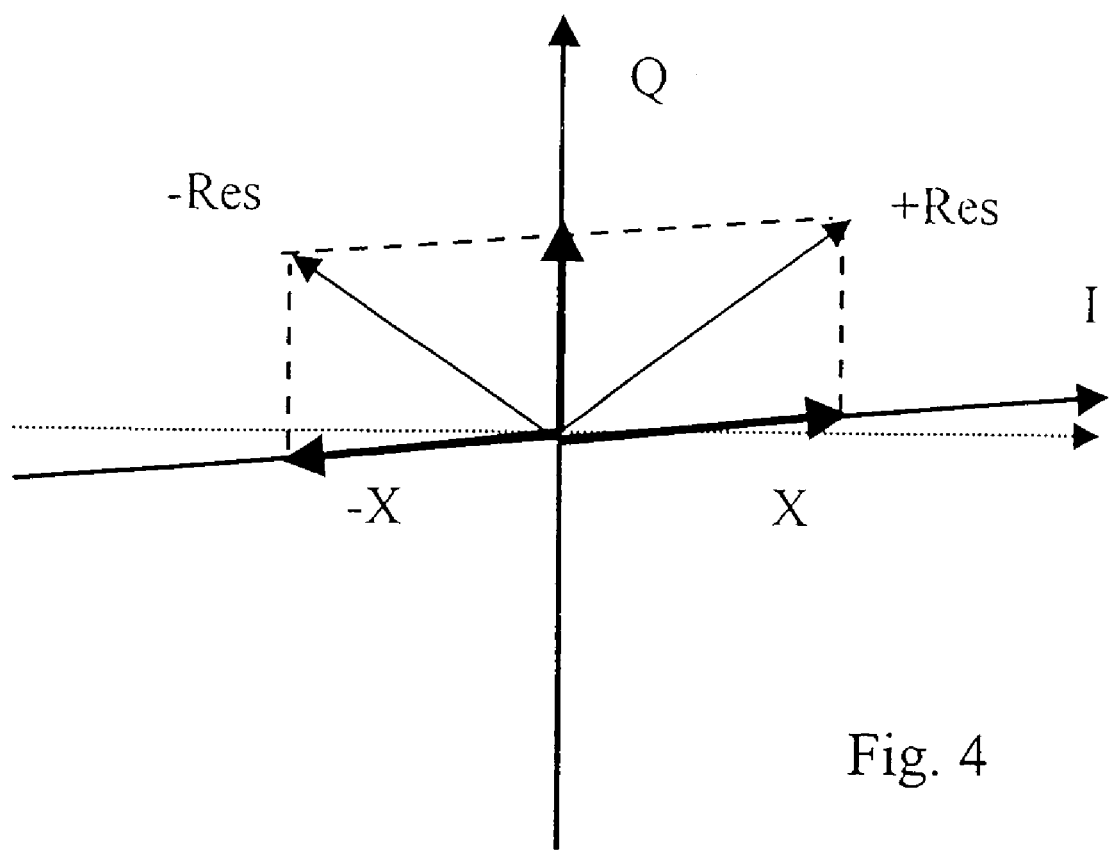

Another error that can be compensated by tuning the station is the so called phase offset. A possibility for the tuning of the phase offset is illustrated in FIG. 4. In the IQ phase offset calibration a corresponding pilot signal X Vdc is applied to the I and Q branches. The resulting output power is then detected by the detector means. The polarity of the X Vdc pilot signal applied to the I branch is then changed and a −X Vdc pilot signal is applied to the I branch. After this the resulting output power is again detected by the detector means.

According to an alternative the phase offset is calibrated so that different amounts of pre-distortion is added to the I and Q branches and then the best matching results are detected. The correct pre-distortion is determined to be found whenever the resulting output powers (+Res and −Res) are substantially similar.

If the above discussed errors are to be detected in association with an I/Q down conversion the IQ down converter can be used for the detection.

The digital signal processor entity 10 may be provided with an appropriate control algorithm for implementing the calibration function. In addition to calibration at the end of manufacture of a station, the control algorithm may include program code means for activating the calibration procedure within predefined time intervals (for example, once in six months, once a year and so on). The station may be provided with an appropriate timer arrangement for enabling such an operation.

The calibration may also be initiated in response to a predefined event, such as a detected change in the operation environment of the station. The calibration may also be initiated in order to improve the quality of transmission, e.g., in response to repeated error messages from the receiving station. The tuning may also be accomplished when the station is switched on. It may not be necessary to tune the station every time it is switched on. Instead, it may be tuned, e.g., every tenth or fiftieth time it is switched on. The user may also activate the tuning, e.g., by pressing appropriate buttons on the station or in response to other similar action taken by the user.

The network may also instruct the station to initiate the calibration. To implement this the communication network may be provided with a node for controlling the self tuning of station in communication with the station of the network and provided with capability to receive such instructions from the network.

As shown by FIG. 1, an amplifier 22 may be provided in at least one of the I and Q branches for correction of an error in the amplitude of the signal. The error in the amplitude may alternatively be corrected by means of the digital signal processor 10.

The test signals are preferably selected to have such levels that they do not disturb other stations.

The pilot i.e. the reference signal may be any signal such as a DC signal that can be used in the determination of differences in output powers resulting from a positive and a negative pilot signal. It shall be appreciated that the pilot signal may also be supplied from a pilot signal source that is external to the station.

The above described tuning procedures have several advantages. During the production of stations such as mobile stations it is believed that the above discussed method provides substantially faster tuning than the prior art solutions. No additional components may be required for the implementation thereof. The proposed method is also robust and should work well with all kinds of stations employing digital modulators. The robustness may assist in reducing the production yield loss that is caused by problems related to tuning of stations.

The proposed tuning procedure also enables a station to tune itself. This may be required for example since the components and/or connections in a station may experience ageing during the lifetime of the station. Changes in operation conditions may also be taken into account by means of the proposed solution. The mobile station may be adapted to detect for temperature drifts and in response to detection of any drifts the compensation procedure will be initiated. The solution enables self-calibration of for example TX IQ, DAC and LPS and modulator errors.

It should be appreciated that whilst embodiments of the present invention have been described in relation to mobile stations, embodiments of the present invention are applicable to any other suitable type of user equipment.

Thus, while there have been shown and described and pointed out fundamental novel features of the present invention as applied to a preferred embodiment thereof, it will be understood that various omissions and substitutions and changes in the form and details of the devices described and illustrated, and in their operation, and of the methods described may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is the intention, therefore, to be limited only as indicated by the scope of the claims appended hereto.

What is claimed is:

1. A DC offset compensation circuit configured to output a first test signal to one of an in-phase (I) branch or a quadrature phase (Q) branch of a modulator circuit and to output a second test signal to the same one of the in-phase (I) branch or the quadrature phase (Q) branch of the modulator circuit, the second test signal being of opposite polarity to the first test signal, said DC offset compensation circuit further configured to respond to values of first and second power measurements made at an output of the modulator circuit, said first and second power measurements corresponding to said first and second test signals, respectively, and to modify a DC offset signal of the same one of the in-phase (I) branch or the quadrature phase (Q) branch of the modulator circuit, where the DC offset signal is modified to have a value determined to minimize a difference between said values of said first and second power measurements.

2. The DC offset compensation circuit of claim 1, wherein the first and second power measurements are obtained at an output of an amplifier having an input coupled to an output of said modulator circuit.

3. The DC offset compensation circuit of claim 1, further configured to output a third test signal to the other of the in-phase (I) branch or the quadrature phase (Q) branch of the modulator circuit and to output a fourth test signal to the same other of the in-phase (I) branch or the quadrature phase (Q) branch of the modulator circuit, the fourth test signal being of opposite polarity to the third test signal, said DC offset compensation circuit further configured to respond to values of third and fourth power measurements made at an output of the modulator circuit, said third and fourth power measurements corresponding to said third and fourth test signals, respectively, and to modify a second DC offset signal of the same other of the in-phase (I) branch or the quadrature phase (Q) branch of the modulator circuit, where the second DC offset signal is modified to have a value determined to minimize a difference between said values of said third and fourth power measurements.

4. The DC offset compensation circuit of claim 1, further configured to apply the DC offset signal to the same one of the in-phase (I) branch or the quadrature phase (Q) branch of the modulator circuit.

5. The DC offset compensation circuit of claim 1, embodied in a digital signal processor.

6. The DC offset compensation circuit of claim 1, embodied in a mobile communication device configured to communicate with a wireless communication system.

7. The DC offset compensation circuit of claim 1, wherein the DC offset compensation circuit is configured to modify the DC offset value in response to an event.

8. The DC offset compensation circuit of claim 7, wherein the event comprises at least one of: expiry of a predefined time period; a change in an operational status; a change in an operational environment; receiving a message; and an action taken by a user.

9. A method comprising:
   outputting a first test signal to one of an in-phase (I) branch or a quadrature phase (Q) branch of a modulator circuit;
   outputting a second test signal to the same one of the in-phase (I) branch or the quadrature phase (Q) branch of the modulator circuit, the second test signal being of opposite polarity to the first test signal;
   responding to values of first and second power measurements made at an output of the modulator circuit, said first and second power measurements corresponding to said first and second test signals, respectively; and
   modifying a DC offset signal of the same one of the in-phase (I) branch or the quadrature phase (Q) branch of the modulator circuit, where the DC offset signal is modified to have a value determined to minimize a difference between said values of said first and second power measurements.

10. The method of claim 9, comprising obtaining said first and second power measurements at an output of an amplifier having an input coupled to an output of said modulator circuit.

11. The method of claim 9, further comprising:
   outputting a third test signal to the other of the in-phase (I) branch or the quadrature phase (Q) branch of the modulator circuit;
   outputting a fourth test signal to the same other of the in-phase (I) branch or the quadrature phase (Q) branch of the modulator circuit, the fourth test signal being of opposite polarity to the third test signal;
   responding to third and fourth power measurements made at an output of the modulator circuit, said third and fourth power measurements corresponding to said third and fourth test signals, respectively; and
   modifying a second DC offset signal of the same other of the in-phase (I) branch or the quadrature phase (Q) branch of the modulator circuit, where the second DC offset signal is modified to have a value determined to minimize a difference between said values of said third and fourth power measurements.

12. The method of claim 11, further comprising: applying the DC offset signal to the same one of the in-phase (I) branch or the quadrature phase (Q) branch of the modulator circuit.

13. The method of claim 9, as carried out in a digital signal processor.

14. The method of claim 9, as carried out in a mobile communication device configured to communicate with a wireless communication system.

15. The method of claim 9, comprising modifying the DC offset value in response to an event.

16. The method of claim 15, wherein the event comprises at least one of: expiry of a predefined time period; a change in an operational status; a change in an operational environment; receiving a message; and an action taken by a user.

17. A DC offset compensation circuit comprising:
   means for outputting a first test signal to one of an in-phase (I) branch or a quadrature phase (Q) branch of a modulator circuit;
   means for outputting a second test signal to the same one of the in-phase (I) branch or the quadrature phase (Q)

branch of the modulator circuit, the second test signal being of opposite polarity to the first test signal;

means for responding to first and second power measurements made at an output of the modulator circuit, said first and second power measurements corresponding to said first and second test signals, respectively; and means for modifying a DC offset signal of the same one of the in-phase (I) branch or the quadrature phase (Q) branch of the modulator circuit, where the DC offset signal is modified to have a value determined to minimize a difference between said values of said first and second power measurements.

18. The DC offset compensation circuit of claim 17, wherein the first and second power measurements are obtained at an output of an amplifier having an input coupled to an output of said modulator circuit.

19. The DC offset compensation circuit of claim 17, comprising:

means for outputting a third test signal to the other of the in-phase (I) branch or the quadrature phase (Q) branch of the modulator circuit;

means for outputting a fourth test signal to the same other of the in-phase (I) branch or the quadrature phase (Q) branch of the modulator circuit, the fourth test signal being of opposite polarity to the third test signal;

means for responding to third and fourth power measurements made at an output of the modulator circuit, said third and fourth power measurements corresponding to said third and fourth test signals, respectively; and means for modifying a second DC offset signal of the same other of the in-phase (I) branch or the quadrature phase (Q) branch of the modulator circuit, where the second DC offset signal is modified to have a value determined to minimize a difference between said values of said third and fourth power measurements.

20. The DC offset compensation circuit of claim 19, further comprising:

means for applying the DC offset signal to the same one of the in-phase (I) branch or the quadrature phase (Q) branch of the modulator circuit.

21. The DC offset compensation circuit of claim 17, as embodied in a digital signal processor.

22. The DC offset compensation circuit of claim 17, as embodied in a mobile communication device configured to communicate with a wireless communication system.

23. The DC offset compensation circuit of claim 17, comprising means for modifying the DC offset value in response to an event.

24. The DC offset compensation circuit of claim 23, wherein the event comprises at least one of: expiry of a predefined time period; a change in an operational status; a change in an operational environment; receiving a message; and an action taken by a user.

25. An apparatus comprising a DC offset compensation circuit according to claim 1.

26. An apparatus comprising a DC offset compensation circuit according to claim 17.

* * * * *